United States Patent [19]
Hörfarter

[11] Patent Number: 5,821,980
[45] Date of Patent: Oct. 13, 1998

[54] DEVICE AND METHOD FOR PRODUCING A SCREEN PRINTING STENCIL HAVING IMPROVED IMAGE SHARPNESS

[75] Inventor: Siegfried Hörfarter, Walchsee, Austria

[73] Assignee: Schablonentechnik Kufstein Aktiengesellschaft, Kufstein, Austria

[21] Appl. No.: 502,848

[22] Filed: Jul. 14, 1995

[30] Foreign Application Priority Data

Jul. 14, 1994 [EP] European Pat. Off. .............. 94110982

[51] Int. Cl.[6] ..................................................... B41J 2/47
[52] U.S. Cl. ............................................................. 347/256
[58] Field of Search .................................. 347/256, 258, 347/259, 260, 241, 134

[56] References Cited

U.S. PATENT DOCUMENTS 3,664,737  5/1972  Lipp .
3,696,742  10/1972  Parts et al. .
4,553,822  11/1985  Mahlein .

FOREIGN PATENT DOCUMENTS 0562149  9/1993  European Pat. Off. .
2634841  8/1976  Germany .

OTHER PUBLICATIONS

Patent Abstracts of Japan, vol. 11, No. 74 (M–568) (2521) Mar. 6, 1987; JPA–61–229560.

*Primary Examiner*—Mark J. Reinhart

[57] ABSTRACT

A device for producing a screen printing stencil has a light source for emitting a bundle of light whose focus lies in the region of a light-sensitive layer present on a stencil screen. Furthermore, there is an apparatus for generating a relative movement between the bundle of light being incident on the light-sensitive layer in accordance with a desired stencil pattern. The bundle of light is linearly polarized in at least one section. An electro-optical modulator for rotating the plane of oscillation of the bundle of light is arranged in this section. The electro-optical modulator rotates the plane of oscillation of the bundle of light in accordance with received stencil pattern data. An analyzer is positioned in the light path downstream of the electron optical modulator. The analyzer passes the bundle of light having a plane of oscillation at one orientation and blocks the bundle of light having a plane of oscillation at an opposite orientation. As a result of the device, the bundle of light is able to be switched on and off of the light-sensitive layer very rapidly, which leads to extremely sharp edges of the pattern structure.

11 Claims, 1 Drawing Sheet

DEVICE AND METHOD FOR PRODUCING A SCREEN PRINTING STENCIL HAVING IMPROVED IMAGE SHARPNESS

BACKGROUND OF THE INVENTION

1. Field of the Invention

The present invention is directed to a device for producing a screen printing stencil having a light source for emitting a bundle of light whose focus lies in the region of a light-sensitive layer present on a stencil screen. Furthermore, the device includes an apparatus for generating relative movement between the bundle of light and the stencil screen, the bundle of light being incident on the light-sensitive layer in accordance with a desired stencil pattern. Screen printing stencils of this type are used, for example, for the printing of textile substrates.

2. Description of the Related Art

During the last 10 years, it has become common, instead of the previously customary large film technique, to transfer a pattern image to the printing form in a suitable manner, for example by means of a correspondingly driven laser. For example, a metallic perforated sleeve can be covered with synthetic resin and this resin can be removed using laser radiation at those locations at which the stencil is intended to be permeable to the printing dye. For this purpose, a long-wave laser radiation of about 10.6 $\mu$m wavelength is commonly used and a $CO_2$ laser, which emits such a radiation, is electrically stimulated in synchronism with the requirements of the pattern image.

The inverse case has also been proposed, in which an only pre-dried but not yet polymerized (that is to say crosslinked) lacquer layer is crosslinked by the effect of laser radiation. For crosslinking, it is generally necessary to use shorter wave length radiation, which lies preferably in the near UV range. Nowadays, it is possible to achieve polymerization effects in synthetic resins at wavelengths up to about 555 nm. Photosensitive agents then have to be added to the resins.

During the switching on and switching off of a laser used for the pattern image generation, there is the risk of an insufficient sharpness in the region of the pattern edges, which is caused by unstable behavior of the laser at the instant of switching. If the switch-on and switch-off edges are not steep enough or are distorted, distorted pattern images are obtained.

One proposed solution involves impressing a signal on a laser beam by means of an acousto-optical modulator and switching this beam on and off. A mechanical oscillation field is generated in the radiation-transparent window of the acousto-optical modulator by means of high frequency sound waves. The closely adjacent stress zones typical for this field differ slightly in terms of their refractive index, as a result of which the laser beam is bent and thus deflected from its original beam direction. The laser beam is then incident on the screen printing stencil in this deflection direction.

However, the switching process is carried out accepting a relatively flat switching edge, since the sound wave front of the modulator window must first of all completely pass through the window at the speed of sound associated with the window. During this passage time, the number of the stress zones increases and complete deflection of the beam is achieved when the entire beam cross-section is filled by stress zones. Therefore, during this time, the optical signal rises or falls from its initial value to its final value.

It is also disadvantageous in this technique that the optical signal remains amplitude-modulated at twice the frequency of the ultrasonic wave. For this reason, only about 70% of the energy of the optical radiation is bent, while 30% of the radiation energy is further emitted in the direction of the unbent beam of zero-th order.

SUMMARY OF THE INVENTION

An object of the present invention is to further develop a screen printing stencil producing device of the type mentioned at the outset in such a way that the device allows the production of even sharper stencil patterns.

This and other objects of the present invention are accomplished by providing a device in which the bundle of light is linearly polarized in at least one section. An electro-optical modulator for rotating the plane of oscillation of the bundle of light is arranged in this section. An analyzer is positioned in the light path downstream of the electro-optical modulator, and the electro-optical modulator rotates the plane of oscillation of the bundle of light in accordance with received stencil pattern data.

In other words, the stencil pattern data are used to drive the electro-optical modulator. If stencil pattern data are present which relate to a region which is intended later to be permeable to the printing ink, in the case of a simple resin layer, the plane of oscillation of the bundle of light is rotated by means of the electro-optical modulator such that the bundle of light can pass through the subsequent analyzer. The resin layer is thus removed by the focussed bundle of light in this region. In the case of lacquer layer to be polymerized, for the same region or the same pattern data, the plane of oscillation of the bundle of light is rotated by means of the electro-optical modulator such that the subsequent analyzer interrupts the bundle of light. This region is thus not crosslinked and can be removed later by suitable development of the layer. In contrast, for those regions of the screen printing stencil which are intended later to be impermeable to the printing ink, the opposite relationships apply.

By means of the combination of the above measures, stencil patterns with sharp edge structure or very accurate engraving edges are produced, even if surface speeds of rotating metal screens are selected which lie in the range of $\geq 2$ m/sec, to a maximum of 12 to 13 m/sec. Thus, on the one hand, as a result of the bundle of light being continuously switched on within a pattern region, satisfactory energy stabilization is achieved, so that upon switching off the bundle of light at the edge of the pattern structure, the energy always falls off from its maximum value, which leads to an abrupt energy transition and thus to a sharp edge structure. In addition, the switch-off times, which can lie in the range of nanoseconds as a result of the electro-optical modulator, ensure, on the other hand, an extremely rapid fall in the energy of the bundle of light. As a result, even at high rotation speeds, no blurring of the structure, which can have a negative effect, can result.

According to an advantageous refinement of the present invention, in the linearly polarized section of the bundle of light, upstream of the electro-optical modulator, there is a polarizer which is followed by a unit which rotates the plane of oscillation of the bundle of light by 45° with respect to the polarizer. Radiation traveling in the direction opposite to the propagation direction of the bundle of light, for example, radiation generated by reflection at the metallic screen of the stencil, can thus no longer pass to the light source and have a negative influence on the latter, since this reflected-back radiation is now coupled out of the beam path and passes, for example, into a beam stop. The unit can be, for example, a Faraday rotator, whose construction is generally known and which makes use of a magnetic field to rotate the plane of oscillation of the bundle of light.

The electro-optical modulator can be a Pockels cell or a Kerr cell and can be driven by a suitable high voltage, which is applied as a function of the above-mentioned pattern data to rotate the plane of oscillation of the bundle of light.

Advantageously, when the light of the bundle of light is blocked, the output of the analyzer is coupled to a power measuring cell. The rotation of the plane of oscillation of the bundle of light which is necessary for the passage of the light and which is carried out by the electro-optical modulator is then adjusted as a function of an output signal of the power measuring cell. During the interruption of the bundle of light, the intensity of the light source is thus measured, so that, in the even of a change of intensity, the plane of oscillation of the bundle of light can be altered for the subsequent switch-on cycle of the bundle of light by means of the electro-optical modulator in such a way that the bundle of light which is switched on always has a constant intensity over the entire engraving process. In order to have sufficient leeway with respect to higher and lower intensities, the high voltage which is applied to the electro-optical modulator is preset such that the plane of oscillation for passing the bundle of light does not completely coincide with the passage direction of the analyzer.

The polarizer and analyzer can be formed, for example, by double prisms. According to a further refinement of the invention, use is made, as a light source, of a laser emitting a linearly polarized bundle of light. This laser can preferably be a diode-pumped Nd-YAG laser, if there are, for example, lacquer layers to be polymerized on the stencil screen.

BRIEF DESCRIPTION OF THE DRAWINGS

The invention is described in more detail below with reference to the drawing, in which.

DETAILED DESCRIPTION OF THE PREFERRED EMBODIMENTS

Figure 1:
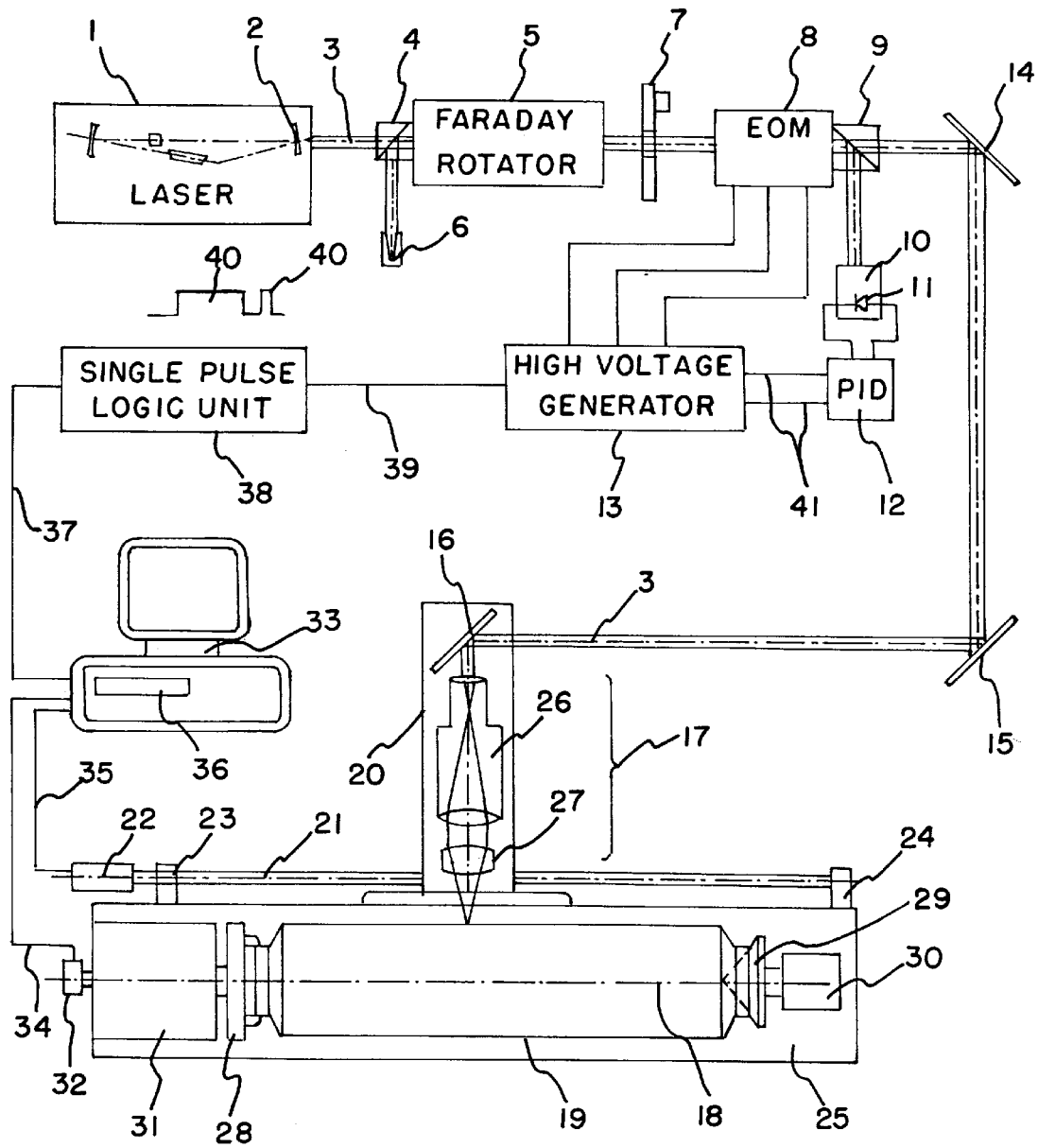
FIG. 1 shows a schematic overall view of a laser engraving device of the present invention.

The construction of the device according to the invention is shown schematically in FIG. 1. A laser 1 emits a linearly polarized laser beam 3 through an exit window 2. The wavelength of the laser beam 3 is advantageously in the range from 500 to 540 nm. For example, the laser 1 can be an argon ion laser whose radiation has a wavelength of 514 nm. The laser 1 can also be a YAG-Neodymium laser with a radiation wavelength in the initial range of 1.06 $\mu$m, which can then be reduced, e.g., by frequency doubling, to 532 nm.

A first polarizer 4, which comprises two Nicol prisms, allows the laser beam 3 to pass through with virtually no losses, since the passage direction of the polarizer 4 coincides with the direction of polarization of the laser beam 3. A Faraday rotator 5, arranged downstream of the polarizer 4 in the beam direction, then rotates the direction of polarization of the laser beam 3 by 45° about its longitudinal axis. Radiation generated, for example, by reflection, in the direction opposite to the propagation direction of the laser beam 3 passes once again into the Faraday rotator 5, so that its plane of polarization is once more rotated there by 45°. This leads to the situation where the plane of polarization of the reflected radiation is now rotated by 90° relative to the passage direction of the polarizer 4 and is thereby coupled by the polarizer 4 out of the beam path, in order to be absorbed in a beam stop 6. In this way, the operating behavior of the laser 1 is stabilized, since reflected radiation can no longer be coupled into it.

Downstream of the Faraday rotator 5, a shutter 7 which interrupts the laser beam 3 in emergencies or in special cases can be located in the beam path of the laser beam 3.

Thereafter, an electro-optical modulator (EOM) 8 is arranged in the beam path of the laser beam 3. This electro-optical modulator 8 can be, for example, a Kerr cell or a Pockels cell. According to the applied voltage, the position of the plane of polarization of the laser beam 3 is rotated by the EOM 8 by a further 90° or is not rotated. Following the electro-optical modulator 8 in the beam path of the laser beam 3 is an analyzer 9, which is likewise constructed from two Nicol prisms. The analyzer 9 couples out the laser beam 3 from the beam path when the laser beam 3 is not intended to be incident on a screen printing stencil and has therefore been rotated by 90° by the electro-optical modulator 8. If, on the other hand, the laser beam 3 is intended to be incident on the screen printing stencil, its plane of polarization would not be rotated by the electro-optical modulator 8, so that the laser beam 3 can pass through the analyzer 9.

For the case where the laser beam 3 is coupled out by the analyzer 9, the laser beam 3 is incident on a power measuring cell 10 which measures the effective beam power at these times. For this purpose, there is a measuring diode 11 in the interior of the power measuring cell 10. This measuring diode 11 is connected to a PID controller 12 which supplies output signals, which are a function of the measured beam power, to a high voltage generator 13. The high voltage generator 13 supplies the necessary high voltage to the electro-optical modulator 8 for the purpose of rotating the plane of polarization of the laser beam 3. By means of the PID controller 12, there is carried out, for the subsequent passage condition of the analyzer 9, a fine adjustment of the high voltage, provided for the electro-optical modulator 8, for setting the radiation power. This adjustment is to set the maximum value of the radiation power to a constant magnitude by corresponding reverse rotation of the plane of polarization of the laser beam 3.

If the polarization direction of the laser beam 3 in the electro-optical modulator 8 is not rotated or rotated only a little, the laser beam 3 can pass through the analyzer 9 with only slight losses. The laser beam 3 is now led via deflection mirrors 14, 15 and 16 to an optics unit 17 which can be moved in the direction of the central axis 18 of the screen printing stencil 19 on a slide 20. The slide 20 is displaced via a spindle 21. The spindle 21 is rotated by means of a direct current motor (stepping motor) 22. The spindle 21 is fastened to a machine bed 25 via mountings 23, 24. The optics unit 17 essentially comprises a beam expander 26 and a focussing lens 27. The beam expansion is provided in order to obtain as small a focus diameter as possible after the focussing the laser beam 3 on the cover of the screen printing stencil 19 by the focussing lens 13.

The screen printing stencil 19 is supported rotatably on the machine bed 25 of an engraving machine and is held on the left-hand side by a chuck 28 and is borne on the right-hand side by a supporting cone 29. The supporting cone 29 is likewise rotatably supported in a tailstock 30. In this arrangement, the tailstock 30 can be displaced on the machine bed 25 in the longitudinal direction of the central axis 18, in order to be able to match its position to various lengths of the screen printing stencil 19. Via the chuck 28, a uniform rotational movement is imparted to the screen printing stencil 19. The chuck 28 is supported in a headstock 31. An encoder 32 on the shaft of the chuck 28 reports the respective rotational position of the screen printing stencil 19 to a central control computer 33 via a line 34. A further encoder in the interior of the direct current motor 22 likewise reports the longitudinal position of the slide 22 with the optics unit 17 located thereon via a further line 35 to the central control computer 33.

Using this input information, and on the basis of the pattern information stored in an electronic memory 36, the central control computer 33 is capable of outputting the necessary beam control information (pulse trains) via a control signal line 37 to a single-pulse logic unit 38. This single-pulse logic unit 38 then outputs single pulses of greater or shorter length via a signal line 39 to the high voltage generator 13 which has already been mentioned. The single pulses carry an engraving signal 40.

The high voltage generator 13 in this arrangement outputs a high voltage to the electro-optical modulator 8 only when it receives corresponding engraving signals 40 via the signal line 39. This high voltage, as already mentioned, is influenced by means of setting signals from the PID controller 12, which pass to the high voltage generator 13 via signal lines 41. These setting signals alter the high voltage output by the high voltage generator 13 to the electro-optical modulator 8 only slightly, and specifically only to such an extent as is necessary for maintaining a constant optical beam power of the laser beam 3. It should be pointed out that the setting of the beam power is carried out only for those times in which the laser beam 3 passes through the analyzer 9. When the laser beam 3 passes to the screen printing stencil, no beam power measurement is carried out. At these times, the value of the beam power in the region of the power measuring cell 10 falls below a predetermined level, so that the PID controller 12 is deactivated.

Figure 2:
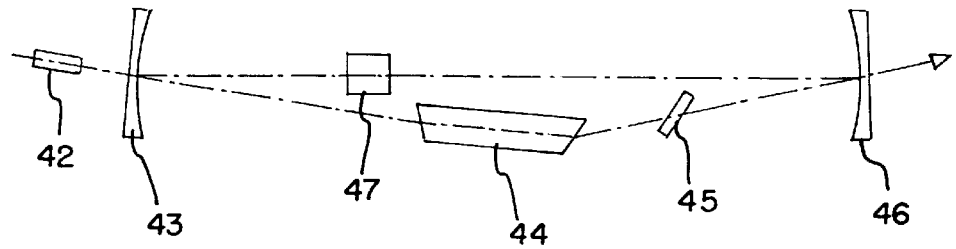
FIG. 2 shows the construction of the laser used in FIG. 1, in more detail.

FIG. 2 shows the more detailed construction of the laser 1, which in this case is a diode-pumped Nd-YAG laser. A semiconductor laser diode 42 emits radiation at a wavelength from 700 to 800 nm. This radiation enters, through the end mirror 43 which is transparent to radiation of this wavelength, into the interior of the resonator. In the interior, there is the Nd-YAG rod (glass or crystal) 44, which is stimulated to laser action. The laser radiation emerges from the right-hand end surface of this rod 44 at the typical angle of refraction and passes through a Brewster plate 45. The Brewster plate 45 ensures that only linearly polarized radiation is produced in the laser. The 1065 nm laser radiation which is emitted by the rod 44 is reflected from the right-hand end mirror 46 (exit window 2 in FIG. 1), which is partially transparent to radiation of 532 nm, and passes through an NLO (non-linear optics) crystal 47, which converts a percentage of the 1065 nm radiation into 532 nm radiation as a consequence of nonlinear optical effects. Both radiation at 532 nm and at 1065 nm is reflected by the left-hand end mirror 33 of the resonator and the cycle described begins anew. At the right-hand end window 46, radiation at 532 nm wavelength is coupled out continuously. By means of the arrangement of the NLO crystal 47 inside the resonator, the crystal is always located in a region of high beam energy and operates with good efficiency.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A device for producing a screen printing stencil comprising:

a light source for emitting a bundle of light traversing a light path and having a focus in a region of a light-sensitive layer present on a stencil screen;

an apparatus which generates a relative movement between the bundle of light and the stencil screen, the bundle of light being incident on the light-sensitive layer in accordance with a desired stencil pattern and being linearly polarized in at least one section;

an electro-optical modulator in the light path which rotates a plane of oscillation of the bundle of light arranged in said at least one section, said electro-optical modulator rotating the plane of oscillation of the bundle of light in accordance with the desired stencil pattern data; and an analyzer in the light path downstream of said electro-optical modulator, wherein, when the light is blocked, the analyzer couples the bundle of light to a power measuring cell, and the rotation of the plane of oscillation of the bundle of light, which is necessary for the passage of the light, by said electro-optical modulator is adjusted as a function of an output signal of said power measuring cell.

2. The device according to claim 1, further comprising in said at least one section, upstream of said electro-optical modulator, a polarizer and a unit, receiving the bundle of light passed through the polarizer, which rotates the plane of oscillation of the bundle of light by 45° with respect to the polarizer.

3. The device according to claim 2, wherein said unit is a Faraday rotator.

4. The device according to claim 1, wherein said electro-optical modulator is one of a Pockels cell and a Kerr cell.

5. The device according to claim 2, further comprising a dummy load to which radiation coming from said unit is coupled by said polarizer.

6. The device according to claim 1, wherein said polarizer and said analyzer are each formed by double prisms.

7. The device according to claim 1, wherein said light source is a laser emitting a linearly polarized bundle of light.

8. The device according to claim 7, wherein said laser is a diode-pumped Nd-YAG laser.

9. A method for producing a screen printing stencil comprising the steps of:

emitting light from a light source;

focussing said light in a region of a light-sensitive layer present on a stencil screen;

generating a relative movement between said light and said stencil screen;

impinging said light on said light-sensitive layer in accordance with a desired stencil pattern;

linearly polarizing said light in at least one section upstream of said stencil screen;

electro-optically rotating a plane of oscillation of said light in said at least one section in accordance with said desired stencil pattern;

optically analyzing electro-optically rotated light using an analyzer;

coupling light when said light is blocked from said analyzer to a power measuring cell;

outputting a control signal from said power measuring cell; and adjusting an amount of electro-optically rotating in accordance with said control signal.

10. The method according to claim 9, further comprising, before said electro-optically rotating, the steps of:

passing said linearly polarized light through a polarizer;

rotating a plane of oscillation of light passed through said polarizer by 45° with respect to said polarizer.

11. The method according to claim 10, wherein, when said light passes undergoes said rotating step before passing through said polarizer, the method further comprises coupling said light passing through said polarizer to a dummy load.

* * * * *